(12) United States Patent
Nakai

(10) Patent No.: US 9,966,166 B2
(45) Date of Patent: May 8, 2018

(54) SHIELDED CONDUCTION PATH

(71) Applicant: Sumitomo Wiring Systems, Ltd., Yokkaichi, Mie (JP)

(72) Inventor: Hirokazu Nakai, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days. days.

(21) Appl. No.: 15/321,283

(22) PCT Filed: Jun. 3, 2015

(86) PCT No.: PCT/JP2015/065992
§ 371 (c)(1),
(2) Date: Dec. 22, 2016

(87) PCT Pub. No.: WO2015/198811
PCT Pub. Date: Dec. 30, 2015

(65) Prior Publication Data
US 2017/0148546 A1    May 25, 2017

(30) Foreign Application Priority Data
Jun. 23, 2014   (JP) ................. 2014-128022

(51) Int. Cl.
*H05K 9/00*   (2006.01)
*H01B 7/17*   (2006.01)
*H01B 7/00*   (2006.01)

(52) U.S. Cl.
CPC ............ *H01B 7/17* (2013.01); *H01B 7/0009* (2013.01)

(58) Field of Classification Search
CPC ... B60R 16/02; B60R 16/023; B60R 16/0215; H01L 24/00; H01L 24/01; H01B 7/00;
(Continued)

(56) References Cited

U.S. PATENT DOCUMENTS 5,184,400 A * 2/1993 Cray .................. H01L 21/4853
257/E21.518
6,900,391 B1   5/2005 Maeda
(Continued)

FOREIGN PATENT DOCUMENTS

JP   2006032084 A    2/2006
JP   2009123461 A *  6/2009  ............... H01B 7/17
(Continued)

OTHER PUBLICATIONS

International Search Report and Written Opinion for Application No. PCTJP2015065992 dated Aug. 18, 2015, 6 pages.
(Continued)

*Primary Examiner* — Timothy Thompson
*Assistant Examiner* — Guillermo Egoavil
(74) *Attorney, Agent, or Firm* — Reising Ethington, P.C.

(57) ABSTRACT

An electric wire and a shielding member configured to electrically shield the electric wire by enclosing an outer circumference thereof. A core wire of the electric wire has a single-core portion which is formed by applying pressure to a portion of a conductor obtained by twisting a plurality of strands together to reduce their cross section. This causes the strands to be brought into intimate contact with each other and form a single body, and a stranded wire portion in which the strands remain in a twisted-together state with no pressure having been applied thereto. The shielding member has a first shielding portion enclosing a portion of the electric wire where the core wire constitutes the single-core portion, and a second shielding portion enclosing a portion of the electric wire where the core wire constitutes the stranded wire portion. The second shielding portion has higher flexibility than the first shielding portion.

2 Claims, 3 Drawing Sheets

(58) Field of Classification Search
CPC ........ H01B 7/20; H01B 7/0009; H01B 11/12;
H01B 7/17; H01B 11/00; H02G 3/04;
H02G 3/38; H02G 3/0468; H02G 3/0481;
H02G 3/06; H05K 9/00; H05K 9/0098
USPC .............................................. 174/350, 102 R
See application file for complete search history.

(56) References Cited

U.S. PATENT DOCUMENTS

| | | | |
|---|---|---|---|
| 9,676,349 B2 * | 6/2017 | Kanagawa | .......... B60R 16/0215 |
| 9,742,168 B2 * | 8/2017 | Kanagawa | ........... H02G 3/0462 |
| 2013/0306346 A1 * | 11/2013 | Izawa | ................. H02G 3/0468 |
| | | | 174/102 R |

FOREIGN PATENT DOCUMENTS

| | | | |
|---|---|---|---|
| JP | 2011173456 A | 9/2011 | |
| JP | 2012206616 A * | 10/2012 | ........... B60R 16/023 |

OTHER PUBLICATIONS

English translation of International Search Report for Application No. PCTJP2015065992 dated Aug. 18, 2015, 2 pages.

* cited by examiner

SHIELDED CONDUCTION PATH

CROSS REFERENCE TO RELATED APPLICATIONS

This application claims the priority of Japanese patent application JP2014-28022 filed on Jun. 23, 2014, the entire contents of which are incorporated herein.

TECHNICAL FIELD

The present invention relates to a shielded conduction path in which an electric wire is enclosed by a shielding member.

BACKGROUND ART

Conventionally, in vehicles such as hybrid automobiles, there are cases where a plurality of electric wires are routed under the floor of a vehicle in order to connect, for example, devices, such as a high-voltage battery, provided in a rear portion of the vehicle to devices, such as an inverter and a fuse box, provided in a front portion of the vehicle. A shielded conduction path for use in such cases is known which is configured to block noise by enclosing an outer circumference of the electric wires with a shielding member.

For example, a shielded conduction path disclosed in Patent Document 1 (JP 2011-173456A) noted below is configured to not only electromagnetically shield an electric wire but also to protect the electric wire against interference from foreign matter by inserting a major portion of the electric wire into a metal pipe. Moreover, at a location around a device, or other locations, where a large number of components are installed and thus the shielded conduction path is required to be flexible, the electric wire is shielded by enclosing the electric wire with a highly pliable braided member formed by braiding a conductive thin metal wire into a tube-shaped mesh. The electric wire is a stranded electric wire in which a conductor obtained by twisting a plurality of strands together is enclosed by a coating. As such, the electric wire can be flexibly bent and routed.

SUMMARY OF INVENTION

With regard to the shielded conduction path that is routed under the floor of a vehicle as described above, there is a demand for minimizing the cross section thereof in consideration of ground clearance. To meet this demand, it is conceivable to reduce the cross section of the shielded conduction path by reducing the cross section of the electric wire itself by replacing the stranded electric wire with a single-core electric wire, which is a conductor composed of a single piece of core wire. However, the single-core electric wire has higher stiffness and hence is more difficult to bend than the stranded electric wire. Thus, there is a problem in that it is difficult to route the single-core electric wire at locations, such as a location around a device, where flexibility is required.

The present design was made in view of the above-described circumstances, and it is an object thereof to provide a shielded conduction path whose cross section can be reduced and which can be routed even at a location where flexibility is required.

A shielded conduction path according to the present design includes an electric wire and a shielding member configured to electromagnetically shield the electric wire by enclosing an outer circumference of the electric wire, wherein a core wire of the electric wire has a single-core portion which is formed by applying pressure to a predetermined portion of a conductor obtained by twisting a plurality of strands together and whose cross section has been reduced as a result of the application of the pressure causing the strands to be brought forcefully into intimate contact with each other and form a single body, and a stranded wire portion in which the plurality of strands remain in a twisted-together state with no pressure having been applied thereto, the shielding member has a first shielding portion enclosing a portion of the electric wire where the core wire constitutes the single-core portion and a second shielding portion enclosing a portion of the electric wire where the core wire constitutes the stranded wire portion, and the second shielding portion has higher flexibility than the first shielding portion.

With the shielded conduction path according to the present design, the inner diameter of the first shielding portion, which encloses a portion of the electric wire where the core wire constitutes the single-core portion, can be reduced in accordance with the cross-sectional size of a single-core wire, and the second shielding portion, which encloses a portion of the electric wire where the core wire constitutes the stranded wire portion, can be disposed at a location where flexibility is required. Thus, the cross section of the shielded conduction path can be reduced, and also the shielded conduction path can be routed even at a location where flexibility is required.

BRIEF DESCRIPTION OF DRAWINGS

FIG. 3 shows cross-sectional views illustrating how a single-core electric wire portion is formed by applying pressure to an electric wire.

DESCRIPTION OF EMBODIMENTS

The following is a description of preferred embodiments.

In the shielded conduction path according to the present design, a configuration may also be adopted in which a cross section of the single-core portion has a circular shape, and the first shielding portion, after insertion of the electric wire therein, is bent so as to follow a predetermined wiring route. With this configuration, the single-core portion is easier to bend three-dimensionally than in the case where, for example, the single-core portion has an elliptical cross-sectional shape, and accordingly, bending of the first shielding portion can be easily performed.

Moreover, in the shielded conduction path according to the present, a configuration may also be adopted in which the stranded wire portion is provided at opposite end portions of the core wire, and the first shielding portion is configured in a tubular shape into which a portion of the electric wire where the core wire constitutes the single-core portion can be inserted by putting together a pair of divided bodies into which the first shielding portion is divided along an axial direction. With this configuration, a state in which the electric wire has been inserted into the first shielding portion can be achieved by placing a portion of the electric wire where the core wire constitutes the single-core portion in one of the divided bodies and putting together this divided body and the other divided body. Thus, the cross section of the first shielding portion can be reduced even more.

Embodiment

Hereinafter, an embodiment will be described in detail with reference to FIGS. 1 to 3.

Figure 1:
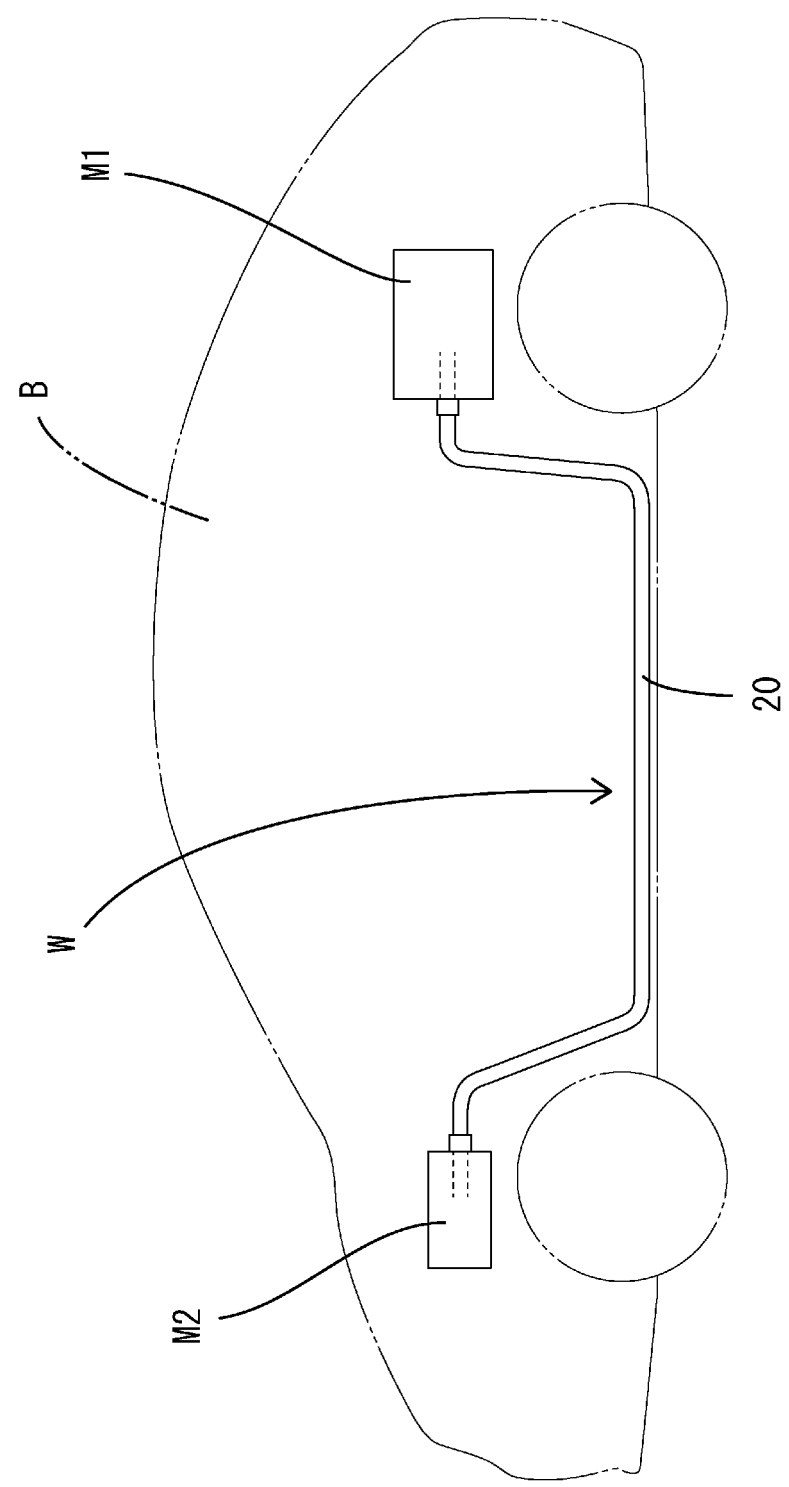
FIG. 1 is a schematic side view showing a wiring route for a shielded conduction path according to an embodiment of the present design.
Figure 2:
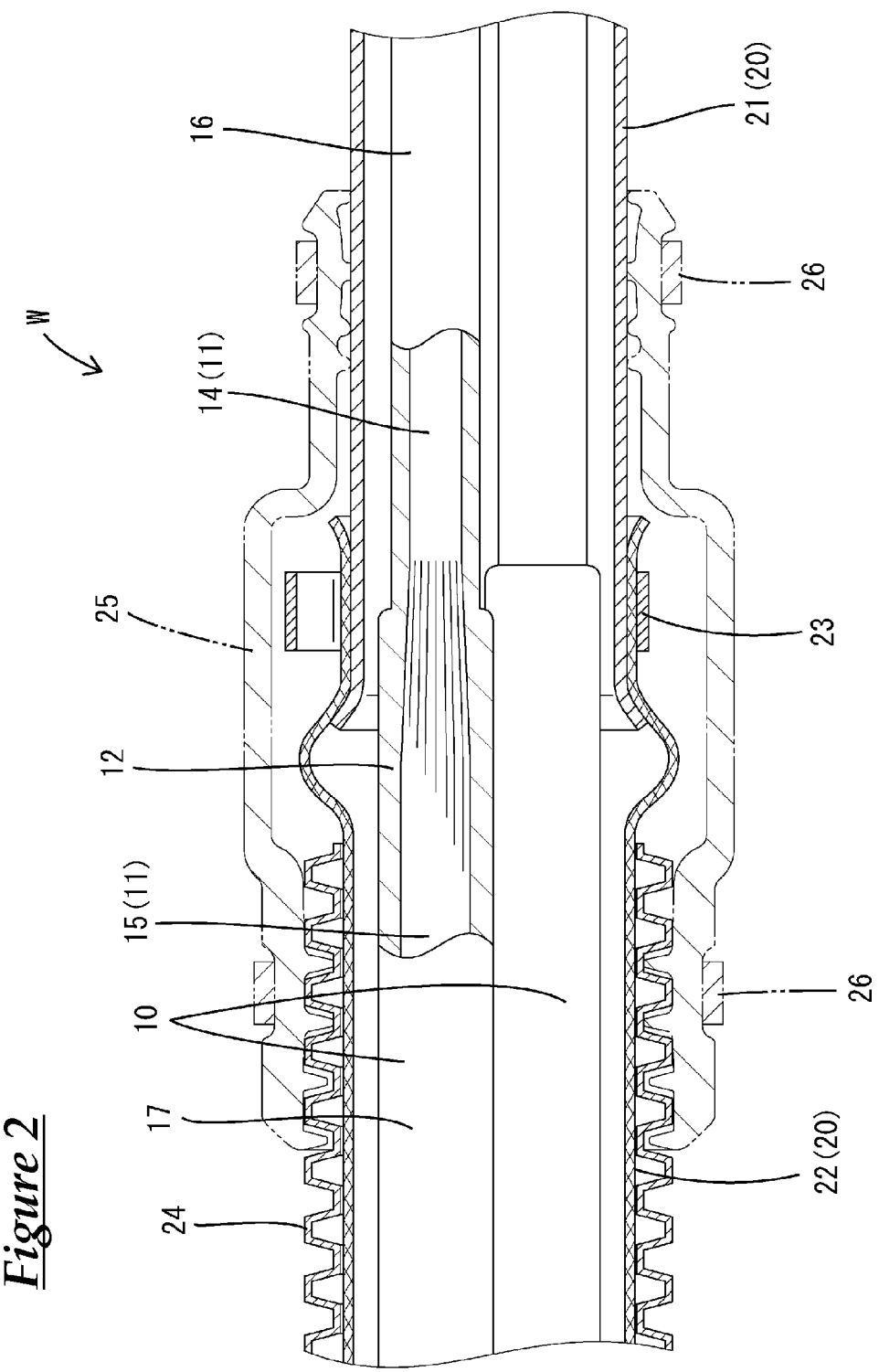
FIG. 2 is a side cross-sectional view showing an area surrounding a connecting portion between a first shielding portion and a second shielding portion in an enlarged manner.

As shown in FIG. 1, a shielded conduction path W according to the present embodiment is routed under a floor of a vehicle B, such as a hybrid vehicle, in order to connect, for example, a device M1, such as a high-voltage battery, that is provided in a rear portion of the vehicle B to a device M2, such as an inverter or a fuse box, that is provided in a front portion of the vehicle B. The devices M1 and M2 are accommodated in conductive shielding cases, respectively.

In the shielded conduction path W of the present embodiment, a plurality of (two, in the present embodiment) electric wires 10 are collectively enclosed and electromagnetically shielded by a shielding member 20.

Each electric wire 10 is a non-shielded electric wire obtained by enclosing an outer circumference of a core wire 11 formed of copper, a copper alloy, aluminum, or an aluminum alloy with an insulating coating 12. The core wire 11 is formed by externally applying pressure to a predetermined portion of a conductor 13 obtained by helically twisting a plurality of strands together. The core wire 11 has a single-core portion 14 whose cross section has been reduced as a result of the application of the pressure causing the strands to be brought forcefully into intimate contact with each other and form a single body, and a stranded wire portion 15 in which the plurality of strands remain in a twisted-together state with no pressure having been applied thereto. The single-core portion 14 and the stranded wire portion 15 are formed to be continuous in the axial direction.

The single-core portion 14 is has relatively high stiffness and is hard to bend, and is formed at an entire intermediate portion of the core wire 11 excluding opposite end portions thereof, or in other words, a portion (portion in which the electric wire 10 is not required to be flexible) that is to be disposed at a location which is under the floor of the vehicle B, for example, and where the electric wire 10 can be routed without being intricately bent.

The stranded wire portion 15 has low stiffness and is easy to bend, and is formed within a predetermined length range at each of the opposite end portions of the core wire 11, or in other words, a portion (portion in which the electric wire 10 is required to be flexible) of the electric wire 10 that is to be routed in such a manner as to meander through gaps in an engine compartment in which a large number of components are installed.

Terminal fittings, which are not shown, are connected to the opposite end portions of the electric wire 10. The terminal fittings are accommodated in respective connectors. The connectors are each fitted to a corresponding connector of the device M1 or M2, and thus electrical connection to the device M1 or M2 side is established.

Next, an example of a method for manufacturing the above-described electric wire 10 will be described.

First, an electric wire to which no pressure has yet been applied (hereinafter referred to as "pre-pressure application electric wire 10A") is cut to a predetermined length corresponding to the wiring route. The pre-pressure application electric wire 10A is obtained by enclosing the conductor 13, which is obtained by twisting a plurality of strands together, with the insulating coating 12.

Figure 3A:
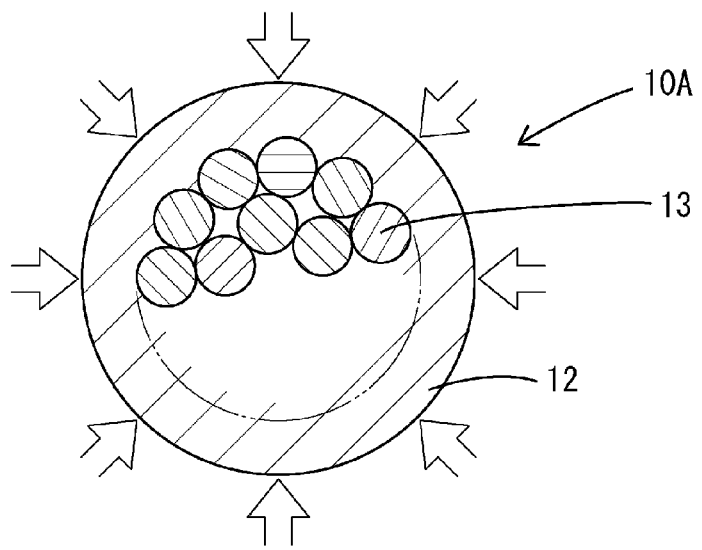
FIG. 3(A) is a cross-sectional view illustrating how pressure is applied to the electric wire to which no pressure has yet been applied.
Figure 3B:
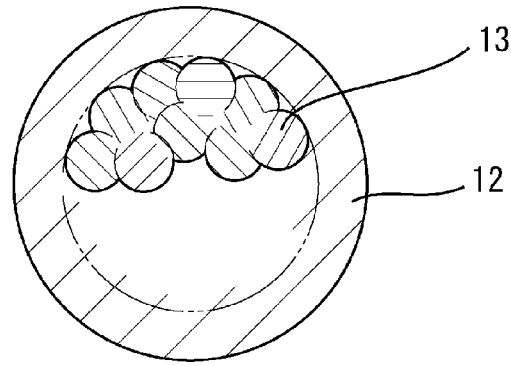
FIG. 3(B) is a cross-sectional view illustrating how the strands are brought into intimate contact with each other.
Figure 3C:
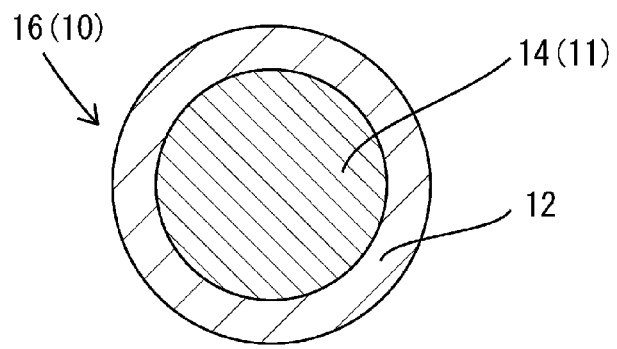
FIG. 3(C) is a cross-sectional view illustrating a state in which the strands are formed into a single body, forming the single-core electric wire portion.

Next, pressure is applied to a predetermined portion of the pre-pressure application electric wire 10A to form the single-core portion 14. The pressure is applied to an outer circumferential surface of the insulating coating 12 of the pre-pressure application electric wire 10A by, for example, pressing, drawing, or the like. At that time, as illustrated in FIG. 3(A), the pressure is applied in such a manner that substantially equal pressure is applied to the entire circumference of the pre-pressure application electric wire 10A. Then, as illustrated in FIG. 3(B), gaps of the conductor 13 (gaps between the plurality of strands) are gradually eliminated, and the strands come forcefully into intimate contact with each other. Ultimately, as illustrated in FIG. 3(C), the strands form a single body (are integrated together) to such an extent that interfaces between them are no longer present, and thus the single-core portion 14 having a circular cross-sectional shape is formed. The cross-sectional area of the resulting single-core portion 14 is about 60 to 70 percent of the cross-sectional area of the conductor 13 of the pre-pressure application electric wire 10A.

The processing speed may be improved by adding ultrasound or heating during the processing. Moreover, it is also possible that the single-core portion 14 is formed by applying pressure to a bare conductor 13 that has not been covered with the insulating coating 12 yet, and afterwards the single-core portion 14 is insulated and protected by, for example, putting a heat-shrinkable tube or an insulating coating on the single-core portion 14.

The shielding member 20 has a first shielding portion 21 enclosing a portion (hereinafter referred to as "single-core electric wire portion 16") of the electric wire 10 where the core wire 11 constitutes the single-core portion 14, and a second shielding portion 22 enclosing a portion (hereinafter "stranded electric wire portion 17") where the core wire 11 constitutes the stranded wire portion 15.

The first shielding portion 21 is a pipe made of metal (iron, aluminum, copper, stainless steel, or the like). The first shielding portion 21 is composed of a pair of divided bodies into which the first shielding portion 21 is divided along the axial direction, and is configured in a tubular shape by putting together the pair of divided bodies, the tubular shape being able to collectively enclose the two electric wires 10. The pair of divided bodies are formed by extrusion molding. Each divided body has a semicircular cross-sectional shape, and the cross-sectional shape of the first shielding portion 21, which is obtained by putting together the divided bodies, is a perfect circle.

After the electric wires 10 are inserted into the first shielding portion 21, the first shielding portion 21 is bent into a three-dimensionally bent shape so as to follow the wiring route for the electric wires 10. It should be noted that the first shielding portion 21 may also be a conductive resin tube, instead of a metal pipe.

The second shielding portion 22 is a braided member formed by braiding a conductive thin metal wire (e.g., copper) into a tube-shaped mesh, and has high pliability. One end of the second shielding portion 22 is crimped with a metal band 23 and fixed to an outer circumferential surface of the first shielding portion 21 so that electrical continuity can be established, and the other end is fixed to a corresponding connector so that electrical continuity can be established. It should be noted that the second shielding portion 22 may also be a metal foil, or a metal foil in which slits are formed, instead of the braided member.

A major portion of the second shielding portion 22 excluding a connecting portion connected to the first shielding portion 21 is enclosed and protected by a corrugated tube 24 having a bellows-like shape and favorable pliability. Moreover, the connecting portion between the first shielding portion 21 and the second shielding portion 22 is enclosed and protected by a grommet 25. One end of the grommet 25 is fixed to an end portion of the first shielding portion 21, and the other end to an end portion of the corrugated tube 24, by respective fastening bands 26.

Next, effects of the embodiment that is configured as described above will be described.

In each electric wire 10 of the present embodiment, the core wire 11 is formed by applying pressure to a predetermined portion of the conductor 13, which is obtained by twisting a plurality of strands together. The electric wire 10 has the single-core portion 14, whose cross section has been reduced by the application of the pressure causing the strands to be brought forcefully into intimate contact with each other and form a single body, and the stranded wire portion 15, in which the plurality of strands remain in the twisted-together state with no pressure having been applied thereto. With this configuration, the stranded wire portion 15, which is easy to bend, can be disposed at a location where flexibility is required, while the single-core portion 14, whose cross section is small, can be disposed at a location where flexibility is not required. Thus, this configuration enables a reduction in cross section and also routing at a location where flexibility is required.

In the case where, for example, a single-core electric wire and a stranded electric wire that are separate electric wires are connected to each other by welding or the like, there is concern about an increase in resistance value due to contact resistance occurring at the connecting portion. However, with the electric wire 10 of the present embodiment, the need to provide such a connecting portion is eliminated, and thus an increase in resistance value can be prevented.

The shielded conduction path W of the present embodiment includes the electric wire 10 and the shielding member 20, which is configured to electromagnetically shield the electric wire 10 by enclosing the outer circumference of the electric wire 10, the shielding member 20 has the first shielding portion 21 enclosing the single-core electric wire portion 16 and the second shielding portion 22 enclosing the stranded electric wire portion 17, and the second shielding portion 22 has higher pliability than the first shielding portion 21. With this configuration, the inner diameter of the first shielding portion 21 enclosing the single-core electric wire portion 16 can be reduced in accordance with the cross-sectional size of the single-core portion 14, and the second shielding portion 22 enclosing the stranded electric wire portion 17 can be disposed at a location where flexibility is required. Thus, this configuration enables a reduction in cross section and also routing at a location where flexibility is required.

Moreover, the cross section of the single-core portion 14 has a circular shape, and the first shielding portion 21 after insertion of the electric wire 10 therein is bent so as to follow a predetermined wiring route. With this configuration, the single-core portion 14 is easier to three-dimensionally bend than in the case where it has, for example, an elliptical cross-sectional shape. Thus, this configuration makes it possible to easily bend the first shielding portion 21.

Moreover, the stranded wire portion 15 is provided at the opposite end portions of the core wire 11, and the first shielding portion 21 is configured in a tubular shape into which the single-core electric wire portion 16 can be inserted by putting together a pair of divided bodies into which the first shielding portion 21 is divided along the axial direction. With this configuration, a state in which the electric wire 10 has been inserted into the first shielding portion 21 can be achieved by placing the single-core electric wire portion 16 in one of the divided bodies and putting together this divided body and the other divided body, and the need to insert the stranded electric wire portion 17 into the first shielding portion 21 is eliminated. Thus, this configuration makes it possible to further reduce the cross section of the first shielding portion 21.

Other Embodiments

The present invention is not limited to the embodiment that has been described above using the drawings, and, for example, embodiments such as those described below are also embraced within the technical scope of the present invention.

In the above-described embodiment, the intermediate portion of the core wire 11 constitutes the single-core portion 14, and the opposite end portions constitute the stranded wire portion 15. However, the present invention is not limited to this, and portions at which the single-core portion 14 and the stranded wire portion 15 are provided can be changed as appropriate. For example, in the case where one end of the shielded conduction path is connected to a device that produces less vibration, and therefore is not required to have flexibility, a configuration may also be adopted in which the stranded wire portion is left on only a side of the core wire where the stranded wire portion is required, and the entirety of the other portions constitutes the single-core portion.

In the above-described embodiment, the cross-sectional shape of the first shielding portion 21 is a perfect circle. However, the present invention is not limited to this, and the first shielding portion 21 may have any shape. For example, the first shielding portion 21 may have an elliptical shape, or may have such a shape that a portion of the first shielding portion 21 that is located on an upper side or a lower side when installed in a vehicle is cut away, and the other portions follow a substantially perfect circle shape. In this case, the height of the first shielding portion can be made smaller than a conventional height by an amount corresponding to that portion on the upper or lower side that has been cut away, and space saving can be achieved accordingly. In addition, the other portions follow a substantially perfect circle shape similar to that of a conventional common shielding pipe, and therefore a conventional pipe bender can be used to perform bending.

In the above-described embodiment, the cross section of the single-core portion 14 has a circular shape. However, the present invention is not limited to this, and the cross section of the single-core portion can have any shape. For example, the single-core portion may be formed so as to have a flat cross-sectional shape by applying pressure to the conductor from one direction or two opposite directions.

In the above-described embodiment, a shielded conduction path W in which the two electric wires 10 are enclosed by the shielding member 20 has been described. However, the number of electric wires may also be one, or may also be three or more.

In the above-described embodiment, the first shielding portion 21 is configured in a tubular shape by putting together a pair of divided bodies, into which the first shielding portion is divided along the axial direction. However, the present invention is not limited to this, and the first shielding portion may also be a member having a tubular shape that is not divided.

LIST OF REFERENCE NUMERALS

W: Shielded conduction path
10: Electric wire
11: Core wire
13: Conductor
14: Single-core portion
15: Stranded wire portion
16: Single-core electric wire portion (portion of electric wire where core wire constitutes single-core portion)
17: Stranded electric wire portion (portion of electric wire where core wire constitutes stranded wire portion)
20: Shielding member
21: First shielding portion
22: Second shielding portion

The invention claimed is:

1. A shielded conduction path comprising:
an electric wire; and
a shielding member configured to electromagnetically shield the electric wire by enclosing an outer circumference of the electric wire,
wherein a core wire of the electric wire has a single-core portion which is formed by applying pressure to a predetermined portion of a conductor obtained by twisting a plurality of strands together and whose cross section has been reduced as a result of the application of the pressure causing the strands to be brought forcefully into intimate contact with each other and form a single body, and a stranded wire portion in which the plurality of strands remain in a twisted-together state with no pressure having been applied thereto,
the shielding member has a first shielding portion enclosing a portion of the electric wire where the core wire constitutes the single-core portion and a second shielding portion enclosing a portion of the electric wire where the core wire constitutes the stranded wire portion,
the second shielding portion has higher flexibility than the first shielding portion, and
wherein a cross section of the single-core portion has a circular shape, and the first shielding portion, after insertion of the electric wire therein, is bent so as to follow a predetermined wiring route.

2. The shielded conduction path according to claim 1, wherein the stranded wire portion is provided at opposite end portions of the core wire, and
the first shielding portion is configured in a tubular shape into which a portion of the electric wire where the core wire constitutes the single-core portion can be inserted by putting together a pair of divided bodies into which the first shielding portion is divided along an axial direction.

* * * * *